United States Patent

[11] 3,588,544

[72] Inventor Clarence Robert Wallingford
Chicago, Ill.

[21] Appl. No. 714,663
[22] Filed Mar. 20, 1968
[45] Patented June 28, 1971
[73] Assignee Hazeltine Research, Inc.

[54] SIGNAL GENERATING CIRCUITS USING INTERNAL SEMICONDUCTOR CAPACITANCE
3 Claims, 5 Drawing Figs.

[52] U.S. Cl. ........ 307/268, 307/280, 307/300
[51] Int. Cl. ........ H03k 5/00, H03k 3/26
[50] Field of Search ........ 307/268, 280, 300, 319

[56] References Cited

UNITED STATES PATENTS

| | | | |
|---|---|---|---|
| 2,991,374 | 7/1961 | Miranda et al. | 307/300X |
| 3,038,084 | 6/1962 | Miranda et al. | 307/300X |
| 3,050,640 | 8/1962 | Dillingham et al. | 307/280X |
| 3,226,575 | 12/1965 | Whittle | 307/268X |
| 3,299,290 | 1/1967 | Moll | 307/300X |
| 3,469,111 | 9/1969 | Peters et al. | 307/235 |

*Primary Examiner*—Stanley D. Miller, Jr.
*Attorney*—Kenneth P. Robinson

ABSTRACT: Disclosed is a semiconductor signal generating circuit which requires no discrete capacitive elements for operation and therefore may be readily constructed in integrated circuit form. The circuit includes a pair of transistors which are supplied, through associated circuitry, with a pulse-type control signal. In response to this control signal the charging and discharging of the internal capacitance of these transistors is controlled to develop an output signal having an amplitude which is proportional to the amplitude of the supplied pulse-type signal and which remains substantially constant for a selected time interval.

SIGNAL GENERATING CIRCUITS USING INTERNAL SEMICONDUCTOR CAPACITANCE

SUMMARY OF THE INVENTION

This invention relates to semiconductor circuits, which utilize the changing and discharging of an internal semiconductor capacitance to generate desired signals, such as those disclosed in applicant's copending divisional application Ser. No. 57,738, filed July 23, 1970.

Many semiconductor circuits such as oscillators, multivibrators and the like include discrete capacitive elements. It is frequently desirable, for example in adapting such circuits for use in integrated form, to provide circuits which do not require discrete capacitive elements.

Objects of the invention are therefore to provide new and useful semiconductor circuits, circuits which eliminate or reduce the number of discrete capacitive elements required, and circuits which generate desired signals by utilizing the charging and discharging of an internal capacitance of a semiconductor device included in the circuit.

In accordance with the invention, there is provided a signal generating circuit which utilizes the charge storage capability of an internal semiconductor and which does not require external discrete capacitors. The circuit includes first and second active semiconductor devices each having first, second and third terminals, and an internal capacitance between the first and second terminals. Further included is unidirectional means for coupling a supplied pulse-type control signal to the first terminal of each device for changing the charge on each of the capacitances from a first set of predetermined values to a second set of predetermined values upon the occurrence of the pulse-type signal. This means additionally causes charge to flow through an impedance means between the semiconductor devices upon the termination of the pulse-type signal, thereby to change the charge on the capacitances to a third set of predetermined values in a selected time interval. Finally included is the aforementioned impedance means which is connected between the third terminal of the first device and the second terminal of the second device, providing a path for the flow of charge therebetween, and for developing, in response to the flow of charge, a pair of ramplike voltages of opposite sense at the third and second terminals respectively, during the selected time interval thereby developing, at substantially the midpoint in the path, an output signal having an amplitude which is proportional to the peak amplitude of the pulse-type control signal and which remains substantially constant throughout the selected time interval.

BRIEF DESCRIPTION OF THE DRAWINGS

Referring to the drawings.

DESCRIPTION OF THE INVENTION

Figure 1:
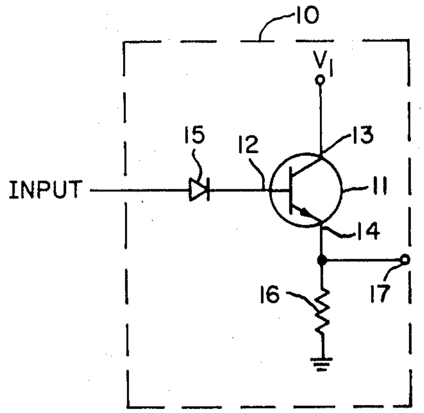
FIG. 1 is a schematic diagram of one form of signal generating circuit in accordance with the invention.
Figure 2:
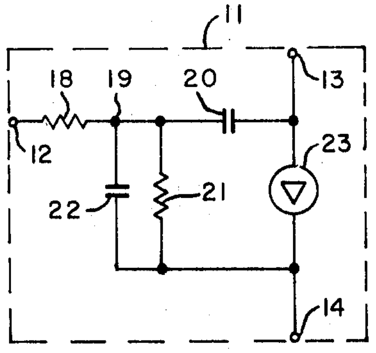
FIG. 2 is a schematic representation of one form of hybrid-pi equivalent circuit for the transistor shown in FIG. 1.

Description of the Circuit of FIGS. 1 and 2

FIG. 1 depicts one form of signal generating circuit which utilizes the charge storage capability of an internal semiconductor capacitance, which is shown to include an active semiconductor device, transistor 11, having an internal capacitance between first and second terminals thereof. These terminals are respectively shown as base terminal 12 and collector terminal 13 which is connected to bias voltage $V_1$. Emitter terminal 14 of transistor 11 represents a third terminal.

Circuit 10 further includes unidirectional means shown as diode 15 for coupling a control signal to transistor 11. This control signal comprises a series of pulses and is coupled through diode 15 to base terminal 12 for changing the charge on the internal base-collector capacitance from a first predetermined value, an initially charged state, to a second predetermined value or discharged state. In the subsequent recharging of the internal base-collector capacitance after a variation in the control signal amplitude such as occurs on the termination of a control signal pulse, diode 15 which is now back biased, causes charge to flow through emitter terminal 14 to return the capacitance to the initially charged state. Recharging occurs in a time interval determined by the collector-base gain $\beta$ of transistor 11, the magnitude of the internal base-collector capacitance, and the magnitude of a resistive load.

Circuit 10 also includes impedance means, resistor 16, which comprises the aforementioned resistive load. Resistor 16 is coupled between emitter terminal 14 and a reference potential, shown as ground, for providing a path for the flow of charge through emitter terminal 14 for developing a waveform which is provided at output terminal 17. The amplitude of this waveform is related to the charge flow.

Referring to FIG. 2 there is shown one version of a conventional high frequency hybrid-pi model for transistor 11 of FIG. 1. Briefly stated, this model includes base terminal 12, collector terminal 13 and emitter terminal 14 which correspond to like terminals in FIG. 1. Base resistor 18 is connected between base terminal 12 and intrinsic base 19. Capacitor 20, shown connected between collector terminal 13 and intrinsic base 19, represents the internal capacitance between base terminal 12 and collector terminal 13. In addition, resistor 21 and capacitor 22 are connected in parallel combination between intrinsic base 19 and emitter terminal 14; and current source 23 is connected between collector terminal 13 and emitter terminal 14.

Operation of the Circuits of FIGS. 1 and 2

To facilitate describing the operation of circuit 10 of FIG. 1, the equivalent circuit model of FIG. 2 may be substituted for transistor 11. The potential of base terminal 12 is assumed to be initially such that transistor 11 cuts off. The first predetermined value of initial charge on capacitor 20 is represented by the voltage across it, which is substantially equal to the magnitude of bias voltage $V_1$.

A control signal is coupled through diode 15 to base terminal 12. This signal is shown in FIG. 3 as a series of pulses and denoted waveform *A*, but other signals having appropriate amplitude variations may also be used.

Figure 3:
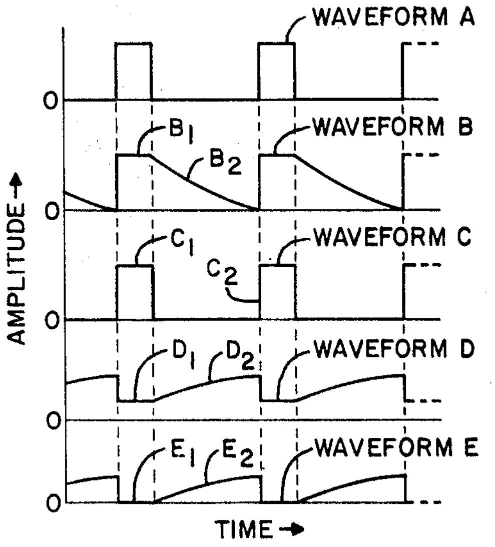
FIG. 3 depicts several waveforms relative to the circuits of FIGS. 1, 2, 4, and 5.

Upon reception of a pulse at base terminal 12, transistor 11 conducts and charge flows through emitter terminal 14 and emitter resistor 16 developing a waveform, such as waveform *B* in FIG. 3, at output terminal 17. During conduction, the charge across internal capacitor 20 is reduced to a second predetermined value represented by the difference between the magnitude of bias voltage $V_1$ and the magnitude of the voltage pulse supplied to base terminal 12.

Assume transistor 11 to now be in the active region. The instantaneous amplitude of the voltage developed at emitter 14 is provided at output terminal 17 and corresponds to $B_1$ of waveform *B*. This voltage is substantially equal to the magnitude of the voltage pulse at base terminal 12 minus the small base-emitter voltage drop of transistor 11. Alternatively, if transistor 11 were saturated, the voltage provided at output terminal 17 corresponding to $B_1$ of waveform *B* would have an amplitude approximately equal to that of bias voltage $V_1$. In this latter instance, for the protection of diode 15, a resistance could be connected in series therewith.

The charge on internal capacitor 20 and thus the amplitude of the voltage waveform provided at output terminal 17, remains constant until termination of the control pulse regardless of whether transistor 11 is saturated or in the active region. After pulse termination, capacitor 20 would ordinarily recharge rapidly to its initial or first predetermined value through the path to ground provided by diode 15. However, diode 15 now becomes back biased, preventing charge from flowing through it in the reverse direction. This causes charge to flow between emitter terminal 14 and intrinsic base 19, so that transistor 11 conducts in the active region. In the active region, source 23 supplies current having a magnitude of approximately $\beta$ times the base current to emitter terminal 14 so that as capacitor 20 recharges to the first predetermined value after termination of a control pulse, the base current multiplied by $(1+\beta)$ flows out emitter terminal 14 through resistor 16 to ground. This recharging is relatively slow in comparison to the prior discharge, and is denoted $B_2$ in waveform $B$. Since approximately $\beta$ times the base current flows through resistor 16, the effective impedance of resistor 16 may be considered as having been multiplied by the quantity $\beta$ so that the circuit time constant, and thus the time interval required for recharging is determined by the impedance of resistor 16, the gain $\beta$ of transistor 11, and the magnitude of capacitor 20. If it is desired to additionally lengthen this time interval, known circuit techniques may be employed, such as substitution of a Darlington transistor pair which has an effective gain of $\beta^2$, for single transistor 11.

If, as shown in FIG. 3, the control signal comprises a series of pulses, an alternating or AC type output waveform will be provided at output terminal 17. Upon termination of each control signal pulse, capacitor 20 will recharge until the initial value of charge is restored and transistor 11 cuts off. However, if the pulses are spaced such that the next pulse is received at base terminal 12 before complete recharging occurs, capacitor 20 will quickly discharge again to the second predetermined value upon reception of this next pulse—without transistor 11 ever reaching cutoff. In this latter instance, a somewhat modified waveform will be provided at terminal 17. Similarly, modified waveforms will result if the control pulses are of different amplitudes.

Assuming the pulses are spaced sufficiently apart to permit full recharging, capacitor 20 recharges and the voltage across it increases correspondingly. In addition, transistor construction is usually such that the capacitance of capacitor 20 is not constant, but varies inversely with the voltage across it. As the voltage increases, the capacitance in fact decreases to advantageously provide a more linear charging rate. Thus, segment $B_2$ of waveform $B$ is more linear than if the magnitude of capacitor 20 remained constant.

Figure 4:
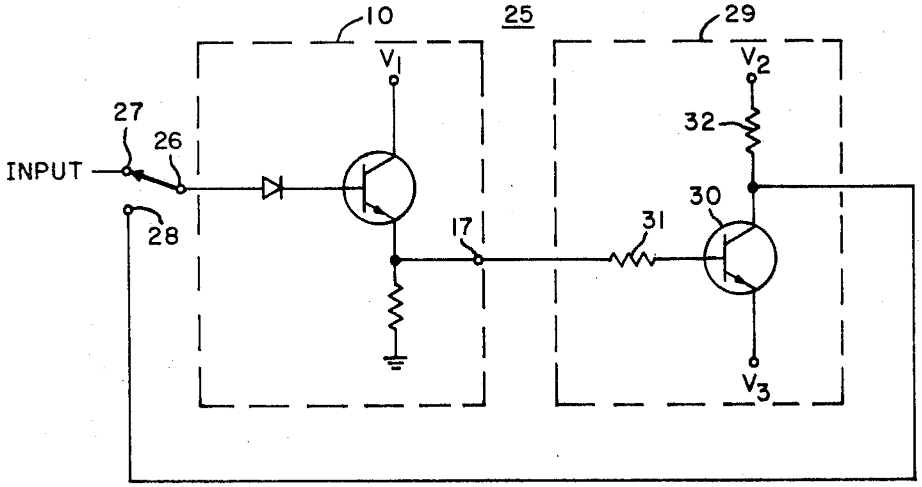
FIG. 4 is a schematic diagram of another circuit which embodies the invention.

Description and Operation of the Circuit of FIG. 4

FIG. 4 depicts a signal generating circuit 25 which utilizes the charge storage capability of an internal semiconductor capacitance. Circuit 25 is operable in either an externally triggered pulse signal generator configuration or a free-running oscillatory signal generator configuration, depending upon whether terminal 26 is connected to input terminal 27 or instead connected to terminal 28. Each of these configurations individually embodies the invention. However, for purposes of illustration, these distinct circuit configurations are depicted and described in an integral manner.

Signal generating circuit 25 is shown to include circuit 10 which, as previously noted, comprises an active semiconductor device shown as transistor 11, unidirectional means shown as diode 15, and impedance means shown as resistor 16.

In the pulse signal generator configuration, circuit 25 additionally includes shaper means shown as inverter circuit 29. Inverter 29 includes transistor 30 which saturates when the amplitude of the waveform provided at terminal 17 of circuit 10 varies a predetermined amount in one direction and which cuts off when this amplitude varies a predetermined amount in the other direction. Inverter 29 thus generates an output pulse in response to variations in the waveform provided at terminal 17. The emitter, base, and collector of transistor 30 are connected to bias voltage $V_3$, to terminal 17 via resistor 31, and to bias voltage $V_2$ via resistor 32, respectively; and the output pulses are provided at the transistor 30 collector which is connected to terminal 28. In addition, alternate circuits, such as a Schmidt trigger circuit, may be substituted for inverter 29 by those skilled in the art.

In the oscillatory signal generating configuration, the previously described output pulse is generated by inverter 29 for use as the control signal. In this latter instance, circuit 25 additionally includes feedback means, shown as the connection from terminal 26 to terminal 28, for supplying the control signal to the anode of diode 15 for causing circuit 25 to be free-running.

In operation, a control signal, as previously described, is coupled to transistor 11. A signal such as waveform $B$ of FIG. 3, is developed at terminal 17 and supplied to inverter 29 which develops shaped output pulses having a desired width. These pulses are developed at the collector of transistor 30 and provided at terminal 28.

More particularly, assume transistor 30 is initially cut off, indicating that the waveform provided at output terminal 17 is of approximately zero amplitude. As shown in FIG. 3, upon reception of a control pulse at the base of transistor 11, the signal amplitude at terminal 17 quickly rises, causing transistor 30 to become saturated. After termination of the pulse, the signal amplitude at the base of transistor 30 decreases until a predetermined value is reached and transistor 30 is cut off. This value may be varied, for example, by appropriate variations of the bias voltages or the magnitudes of the resistors, to alter the pulse width. Inverter 29 inherently provides a delay due to the finite switching time of transistor 30. Therefore, if the signal provided at terminal 28 is coupled via terminal 26 to the anode of diode 15, circuit 25 functions as a free-running oscillator.

Circuit 25 is thus capable of performing functions analogous to those performed by pulse generators, monostable multivibrators, oscillators, and the like except that circuit 25 requires no discrete capacitive elements.

Figure 5:
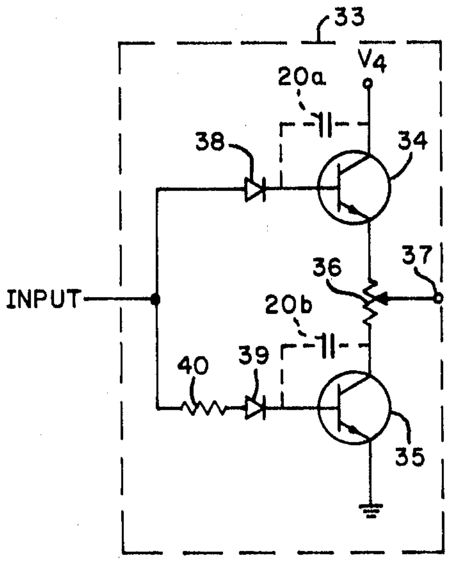
FIG. 5 is a diagram of yet another circuit in accordance with the invention.

Description and Operation of the Circuit of FIG. 5

FIG. 5 depicts a signal generating circuit 33 which utilizes the charge storage capability of internal semiconductor capacitances. Circuit 33 may, for example, be used to generate a relatively constant or DC level output signal in response to a control signal input such as waveform $C$ in FIG. 3. Circuit 33 includes first and second active semiconductor devices, transistors 34 and 35, having internal base terminal to collector terminal capacitance, represented by capacitors 20$a$ and 20$b$, respectively.

Circuit 33 further includes unidirectional means, shown as diodes 38 and 39, for individually coupling a control signal, such as that previously described, to transistors 34 and 35, respectively. This control signal is coupled to the base terminal of each transistor for changing the charge on capacitors 20$a$ and 20$b$ from a first set of predetermined values to a second set of predetermined values. After termination of a control pulse diodes 38 and 39, which are now reverse biased, cause charge to flow between the emitter of transistor 34 and the collector of transistor 35 to change the charge on capacitors 20$a$ and 20$b$ to a third set of predetermined values.

With proper circuit parameters, such as transistors 34 and 35 having similar characteristics, including the internal transistor capacitances represented by capacitors 20$a$ and 20$b$, being of approximately equal magnitude, capacitors 20$a$ and 20$b$ will charge at approximately equal rates to substantially this third set of predetermined values in a time interval determined by the gain of transistors 34 and 35, the magnitudes of capacitors 20$a$ and 20$b$, and the magnitude of a resistive load.

Circuit 33 further includes impedance means, shown as resistor 36, connected between the emitter terminal of transistor 34 and the collector terminal of transistor 35. Resistor 36, which represents the above mentioned resistive load, provides a path for the flow of charge between transistors 34 and 35 for developing an output signal. This output signal is developed at the resistive midpoint of resistor 36 and is supplied to output terminal 37. The output signal persists for at least the entire aforementioned time interval and is of an amplitude substantially equal to one-half the amplitude of the supplied control pulse.

For the protection of diode 39, resistor 40 is shown connected in series therewith. If desired, a resistor of appropriate value may similarly be inserted in series with diode 38.

With reference to the operation of signal generator 33, an equivalent circuit model as shown in FIG. 2, may be substituted for each of transistors 34 and 35. A control pulse such as $C_1$ of FIG. 3 is simultaneously coupled through diodes 38 and 39 to the base terminals of transistors 34 and 35. Prior to reception of this pulse, each of capacitors 20a and 20b have a first predetermined value of charge thereacross. In the instance where the control signal comprises a series of appropriately spaced pulses, this first predetermined value corresponds to the third predetermined value of charge developed across the respective capacitors in response to the previously received pulse. With regard to capacitor 20a, the voltage created by this first predetermined value of charge is $V_4-(C_0/2)$, where $C_0$ represents the amplitude of the previously received pulse, and $V_4$ represents the collector supply voltage of transistor 34. Similarly, with regard to capacitor 20b, the voltage created by this first predetermined value of charge is represented by $C_0/2$.

It should be noted that upon reception of the very first control pulse, the first predetermined values of charge across capacitors 20a and 20b will depend on the steady state circuit conditions and may obviously be other than the particular values indicated.

Upon reception of a control pulse such as $C_1$ in FIG. 3, transistors 34 and 35 are biased such that transistor 34 conducts in the active region and transistor 35 saturates, quickly changing the charge on capacitances 20a and 20b to the second set of predetermined values. Since $C_1$ is the amplitude of the received control pulse, the voltages associated with the second predetermined values of charge for capacitors 20a and 20b are $(V_4-C_1)$, and zero, respectively, and are represented by $D_1$ and $E_1$ in FIG. 3.

Assuming the magnitude of $C_1$ is large relative to the forward voltage drop of diodes 38 and 39 and to the active base-emitter voltage drop of transistor 34, the output signal developed at terminal 37 has an amplitude substantially equal to one-half the amplitude of the supplied control pulse $C_1$. This amplitude remains substantially constant until termination of the control pulse.

After termination of a pulse, capacitors 20a and 20b would ordinarily quickly charge through the path to ground provided by diodes 38 and 39, respectively. However, as noted in connected with FIG. 1, a diode permits charge to flow in only one direction. Thus, diodes 38 and 39, which are now back biased, cause charge to flow through transistors 34 and 35 and through the path provided by resistor 36. This charge flow biases transistors 34 and 35 in the active region causing the respective base-collector voltages of transistors 34 and 35 to increase at a slow rate, and causing capacitors 20a and 20b to charge slowly to the third predetermined value represented by $(V_4-C_1/2)$, and $C_1/2$, respectively, as shown by $D_2$ and $E_2$ FIG. 3. If the pulses are spaced relatively close together, capacitors 20a and 20b may not have charged to their respective values of $(V_4-C_1/2)$ and $C_1/2$ when the next pulse is received. In such cases the third predetermined values correspond to the charges on the respective capacitors at the time of reception of the next pulse. This third predetermined value now becomes the first predetermined value with respect to the next received control pulse.

Since all the control pulses shown in FIG. 3 are of equal amplitude and appropriate spacing, the first predetermined value of charge on capacitor 20a which depends on the amplitude of the previously received pulse, and the third predetermined value of charge on capacitor 20a which depends on the amplitude of the presently received pulse, are both equal. Waveform D of FIG. 3 which represents the charge across capacitor 20a, is thus shown to be repetitively increasing to the same amplitude after termination of each control pulse. This result, represented by waveform E, also occurs with respect to capacitor 20b.

Assuming that transistors 34 and 35 have similar gain characteristics and the magnitudes of capacitors 20a and 20b are approximately equal, the voltage across capacitor 20a and the voltage across capacitor 20b will increase at substantially equal rates. Since transistors 34 and 35 are in the active region during the time the voltage across capacitors 20a and 20b increases, the magnitude of the voltage with respect to ground at the emitter of transistor 34 decreases and may be likened to a decreasing ramp generator. Similarly, the magnitude of the voltage with respect to ground at the collector of transistor 35 increases in the manner of an increasing ramp generator. This increase in voltage is substantially equal to the voltage decrease at the emitter of transistor 34, so that the magnitude of the voltage developed at the resistive midpoint of resistor 36 remains substantially constant.

This constant amplitude voltage is supplied to output terminal 37 which is connected to the resistive midpoint. An output signal is thus provided which is substantially equal to one-half the amplitude of the input pulse. The output signal persists for at least the time interval during which capacitors 20a and 20b continue to charge at a rate which maintains transistors 34 and 35 in the active region. This time interval is proportional to the circuit time constant, and is thus determined by the impedance of resistor 36, the gains of transistors 34 and 35, and the magnitude of capacitors 20a and 20b.

If it is desired to additionally lengthen this time interval, known circuit techniques may be employed such as the substitution of Darlington transistor pairs which have effective current gains of $\beta^2$ for each of transistors 34 and 35.

Upon reception of another control pulse such as $C_2$ in FIG. 3, the charge on capacitors 20a and 20b will decrease to provide an output signal at terminal 37 having a magnitude substantially equal to one-half the magnitude of $C_2$, and the previously described operation of circuit 33 will be repeated. It should be noted that since the amplitude of each control pulse is substantially equal, the output signal provided at terminal 37 will be a DC level substantially equal to one-half this pulse amplitude.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

I claim:

1. A signal generating circuit which utilizes the charge storage capability of an internal semiconductor capacitance in lieu of external discrete capacitors and can therefore be readily constructed in integrated circuit form, comprising:

first and second active semiconductor devices, each having first, second and third terminals, and an internal capacitance between said first and second terminals;

unidirectional means for coupling a supplied pulse-type control signal to the first terminals of said devices for changing the charge on each of said capacitances from a first set of predetermined values to a second set of predetermined values upon the occurrence of said pulse-type signal and for causing charge to flow through an impedance means between said devices upon the termination of said pulse-type signal, thereby to change the charge on said capacitances to a third set of predetermined values in a selected time interval; and impedance means, connected between the third terminal of said first device and the second terminal of said second device and providing a path of fixed impedance for the flow of charge therebetween, for developing, in response to said flow of charge, a pair of ramplike voltages of opposite sense at said third and second terminals respectively during said time interval thereby to develop at substantially the midpoint in said path an output signal having an amplitude which is proportional to the peak amplitude of said pulse-type control signal and which remains substantially constant throughout said time interval.

2. A signal generating circuit as described in claim 1, wherein said semiconductor devices are first and second transistors, each having base, collector and emitter terminals which comprise said first, second and third terminals, respectively, and said unidirectional means causes charge to flow between said devices upon the termination of said pulse-type control signal thereby to change the charge on said capacitances to said third set of predetermined values in a selected time interval determined by the gains of said transistors, the magnitudes of said internal capacitances, and the magnitude of the impedance provided between said devices by said impedance means.

3. A signal generating circuit which utilizes the charge storage capability of an internal semiconductor capacitance in lieu of external discrete capacitors and can therefore be readily constructed in integrated circuit form, comprising:

first and second transistors, each having base, collector and emitter terminals, and an internal capacitance between said base and collector terminals;

first and second diodes for coupling a supplied pulse-type control signal to the base terminals of said first and second transistors, respectively, for changing the charge on said capacitances from a first set of predetermined values to a second set of predetermined values upon the occurrence of said pulse-type control signal and for causing charge to flow through a tapped resistor between said transistors upon termination of said pulse-type control signal thereby to change the charge on said capacitances at substantially equal rates to a third set of predetermined values in a selected time interval determined by the gains of said transistors, the magnitudes of said internal capacitances, and the magnitude of said tapped resistor; and a tapped resistor connected between the emitter terminal of said first transistor and the collector terminal of said second transistor and providing a path of fixed resistance for the flow of charge between said transistors for developing, in response to said flow of charge a pair of ramplike voltages of opposite sense at the emitter and collector terminals of said first and second transistors, respectively, during said time interval thereby to develop an output signal at a tapped midpoint of said resistor, said output signal having an amplitude which is substantially equal to one-half the peak amplitude of said pulse-type control and which remains substantially constant throughout said time interval.